(12) United States Patent
Chetlur et al.

(10) Patent No.: US 6,291,848 B1
(45) Date of Patent: Sep. 18, 2001

(54) INTEGRATED CIRCUIT CAPACITOR INCLUDING ANCHORED PLUGS

(75) Inventors: Sundar Srinivasan Chetlur, Orlando, FL (US); James Theodore Clemens, Watchung, NJ (US); Sailesh Mansinh Merchant, Orlando, FL (US); Pradip Kumar Roy, Orlando, FL (US); Hem M. Vaidya, Orlando, FL (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/364,767

(22) Filed: Jul. 30, 1999

Related U.S. Application Data

(60) Provisional application No. 60/115,781, filed on Jan. 13, 1999.

(51) Int. Cl.$^7$ ................................................. H01L 27/108
(52) U.S. Cl. ........................... 257/306; 257/309; 257/532
(58) Field of Search ..................................... 257/306, 309, 257/532, 301, 304, 303, 308

(56) References Cited

U.S. PATENT DOCUMENTS 5,903,493   5/1999  Lee ........................................ 365/149
5,976,981 * 11/1999  Cheng .................................... 257/306
6,103,586 *  8/2000  Chetlur et al. ......................... 438/396

FOREIGN PATENT DOCUMENTS

97/15950    1/1997  (WO) ......................... H01L/21/8242

* cited by examiner

Primary Examiner—Mark V. Prenty
(74) Attorney, Agent, or Firm—Allen, Dyer, Doppelt, Milbrath & Gilchrist, P.A.

(57) ABSTRACT

An integrated circuit capacitor includes a substrate, a first dielectric layer adjacent the substrate and having a first trench therein, and a first metal plug extending upwardly into the first trench. An interconnection line overlies the first trench and contacts the first metal plug to define anchoring recesses on opposite sides of the first metal plug. A second dielectric layer is on the interconnection line and has a second trench therein. A second metal plug extends upwardly into the second trench. More particularly, the second metal plug includes a body portion extending upwardly into the second trench, and anchor portions connected to the body portion and engaging the anchoring recesses to anchor the second metal plug to the interconnection line. Because the second metal plug is anchored, a depth of the second trench can be greater without the metal plug becoming loose and separating from the underlying interconnection line.

33 Claims, 4 Drawing Sheets

INTEGRATED CIRCUIT CAPACITOR INCLUDING ANCHORED PLUGS

RELATED APPLICATION

This application is based upon prior filed copending provisional application No. 60/115,781 filed Jan. 13, 1999, the entire disclosure of which is incorporated herein by reference.

FIELD OF THE INVENTION

The present invention relates to the field of semiconductor devices, and, more particularly, to a capacitor.

BACKGROUND OF THE INVENTION

Capacitors are used extensively in electronic devices for storing an electric charge. A capacitor includes two conductive plates or electrodes separated by an insulator. The capacitance, or amount of charge held by the capacitor per applied voltage, depends upon the area of the plates, the distance between them, and the dielectric value of the insulator. Capacitors may be formed within a semiconductor device, such as, for example, a dynamic random access memory (DRAM) or an embedded DRAM.

As semiconductor memory devices become more highly integrated, the area occupied by the capacitor of a DRAM storage cell shrinks, thus decreasing the capacitance of the capacitor because of its smaller electrode surface area. However, a relatively large capacitance is desired to prevent loss of stored information. Therefore, it is desirable to reduce the cell dimension and yet obtain a high capacitance, which achieves both high cell integration and reliable operation.

One technique for increasing the capacitance while maintaining the high integration of the storage cells is directed toward the shape of the capacitor electrodes. In this technique, the polysilicon layer of the capacitor electrodes may have protrusions, fins, cavities, etc., to increase the surface area of the capacitor electrode, thereby increasing its capacitance while maintaining the small area occupied on the substrate surface.

Instead of forming the capacitor on the substrate surface, capacitors are also formed above the substrate, i.e., they are stacked above the substrate. The surface area of the substrate can then be used for forming transistors. With respect to increasing the capacitance of a stack capacitor, U.S. Pat. No. 5,903,493 to Lee discloses a capacitor formed above a tungsten plug. The surface area of the capacitor is increased by etching a trench in the dielectric layer around the tungsten plug. The tungsten plug interfaces with an underlying interconnection line, thus allowing different layers formed above the substrate to be connected.

The trench is patterned by conventional etching or other suitable techniques. The fundamental limit on how far the trench can be etched is determined by how well the tungsten plug is anchored or secured within the dielectric layer. Typically, the depth of the trench is limited to about one half the thickness of the dielectric layer. After the trench has been etched, a capacitor is formed above the tungsten plug. Unfortunately, if the trench is etched beyond one half the thickness of the dielectric, the tungsten plug is more likely to become loose and fall out. This physical separation between the tungsten plug and the underlying metal interconnection with the interconnection line can cause open circuits to be formed resulting in complete failure of the device or circuit incorporating the capacitor.

SUMMARY OF THE INVENTION

In view of the foregoing background, it is therefore an object of the present invention to increase the capacitance of a capacitor without reducing the reliability thereof.

This and other advantages, features and objects in accordance with the present invention are provided by an integrated circuit capacitor comprising a substrate, a first dielectric layer adjacent the substrate and having a first trench therein, and a first metal plug extending upwardly into the first trench. An interconnection line overlies the first trench and contacts the first metal plug to define anchoring recesses on opposite sides of the first metal plug. A second dielectric layer is on the interconnection line and has a second trench therein. A second metal plug extends upwardly into the second trench. More particularly, the second metal plug includes a body portion extending upwardly into the second trench, and anchor portions connected to the body portion and engaging the anchoring recesses to anchor the second metal plug to the interconnection line. The body portion and the anchor portions are preferably formed as a monolithic unit.

An important feature of the present invention is that the first metal plug preferably extends upwardly in a medial portion of the first trench so that the interconnection line overlies the first trench and contacts the first metal plug defining the anchoring recesses on opposite sides thereof. The first trench thus provides the anchoring recesses when the interconnection line is formed. In other words, the resulting topography of the interconnection line adjacent the first metal plug creates the anchoring recesses for the second metal plug. This is advantageously done without having to perform additional processing steps for forming equivalent recesses directly within the conductor portion of the interconnection line.

Because the second metal plug is anchored, a depth of the second trench can be greater without the second metal plug becoming loose and separating from the underlying interconnection line. If this were to occur, an open circuit would occur resulting in failure of the device or circuit incorporating the integrated circuit capacitor. The anchoring recesses formed on opposite sides of the second metal plug allows the depth of trench to be increased to thereby increase the capacitance, and without reducing the reliability of the integrated circuit capacitor.

The capacitor also preferably includes first and second electrodes and a third dielectric layer therebetween. The first electrode lines the trench and contacts the second metal plug. The third dielectric layer overlies the first electrode, and the second electrode overlies the third dielectric layer. Increasing the depth of the second trench in accordance with the present invention increases the surface area of the first and second electrodes. This advantageously increases the capacitance of the capacitor, which is desired for preventing a loss of stored information.

DETAILED DESCRIPTION OF THE DRAWINGS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout. The dimensions of layers and 4 regions may be exaggerated in the figures for greater clarity.

Figure 1:
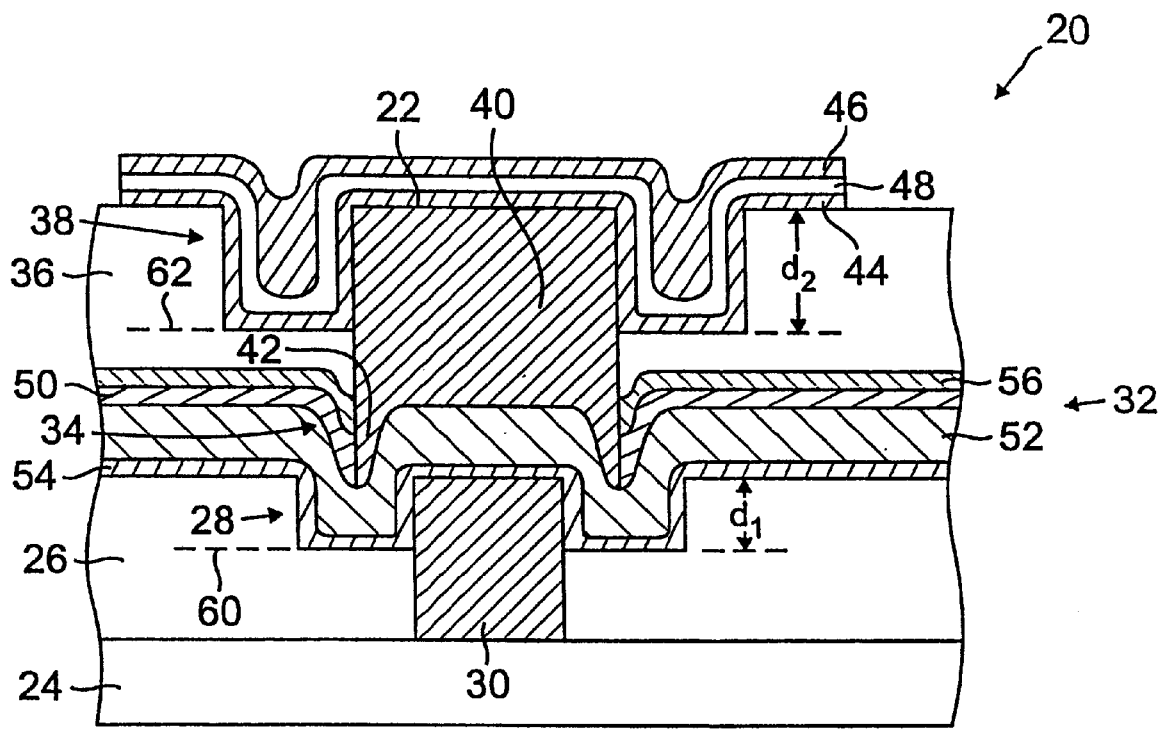
FIG. 1 is a cross-sectional view of an integrated circuit capacitor including an anchored metal plug in accordance with the present invention.

Referring initially to FIG. 1, a cross-sectional view of an integrated circuit capacitor 20 including an anchored metal plug 22 is now described. The integrated circuit capacitor 20 is formed on a substrate 24 with a first dielectric layer 26 adjacent the substrate having a first trench 28 therein. A first metal plug 30 extends upwardly into the first trench 28. An interconnection line 32 overlies the first trench 28 and contacts the first metal plug 30 to define anchoring recesses 34 on opposite sides of the first metal plug. The anchoring recesses 34 anchor the second metal plug 22 to the interconnection line 32 to prevent the plug from becoming loose and separating therefrom.

The anchoring recesses 34 may take a variety of forms. For example, the anchoring recesses 34 may be a continuous recess. That is, when the first metal plug 30 is circular, then the first trench 28 formed in the first dielectric layer 26 adjacent the first metal plug is also circular. This in turn causes the anchoring recesses 34 to be a circular recess when the interconnection line 32 is formed. Instead of the anchoring recesses 34 being a continuous recess, they may be defined such that they comprise a plurality of recesses spaced apart in a circular fashion adjacent the first metal plug 30. For example, the anchoring recesses 34 my comprise two or four recesses, with each recess opposite one of the other recesses.

A second dielectric layer 36 is on the interconnection line 32 and has a second trench 38 therein. The second metal plug 22 comprises a body portion 40 extending upwardly into the second trench 38, and anchor portions 42 connected to the body portion and engaging the anchoring recesses 34 to anchor the second metal plug to the interconnection line 32. Because the second metal plug 22 is anchored, a depth $d_2$ of the second trench 38, for example, can be greater than half the thickness of the second dielectric layer 36 without the second metal plug becoming loose and separating from the underlying interconnection line 32. If this were to occur, an open circuit would occur resulting in failure of the device or circuit incorporating the integrated circuit capacitor 20.

The integrated circuit capacitor 20 includes first and second electrodes 44, 46 and a third dielectric layer 48 therebetween. The first electrode 44 lines the second trench 38 and contacts the second metal plug 22. The third dielectric layer 48 overlies the first electrode 44, and the second electrode 46 overlies the third dielectric layer. As semiconductor devices become more highly integrated, such as, for example, an embedded dynamic random access memory (EDRAM), the capacitance of a capacitor would otherwise decrease because of its smaller available electrode surface area. However, a relatively large capacitance is desired to prevent loss of stored information. Therefore, increasing the depth $d_2$ of the second trench 38 in accordance with the present invention increases the surface area of the first and second electrodes 44, 46. This advantageously increases the capacitance of the capacitor 20.

The illustrated interconnection line 32 includes a multilayer interconnect formed on the first dielectric layer 26. The first dielectric layer 26 is formed on or above the semiconductor substrate 24. The semiconductor substrate 24 contains a plurality of active devices, such as transistors, which are connected together into functional circuits by the interconnection line 32. The first metal plug 30 electrically connects the interconnection line 32 to one or more of the active devices in the underlying semiconductor substrate 24. Alternatively, the first metal plug 30 may be directly connected to an underlying interconnection line (not shown) instead of to the semiconductor substrate 24, as will be readily appreciated by one skilled in the art. The first metal plug 30 preferably includes tungsten or any suitable, electrically conductive material such as aluminum, titanium or titanium nitride.

An important feature of the present invention is that the first metal plug 30 extends upwardly in a medial portion of the first trench 28 so that the interconnection line 32 overlies the first trench and contacts the first metal plug defining the anchoring recesses 34 on opposite sides thereof. The first trench 28 thus provides the anchoring recesses 34 when the interconnection line 32 is formed. In other words, the resulting topography of the interconnection line 32 adjacent the first metal plug 30 creates the anchoring recesses 34. This is advantageously done without performing additional processing steps for forming equivalent recesses directly within the conductor portion 52 of the interconnection line 32.

The first trench 28 is patterned, e.g., by conventional etching or other suitable techniques. For example, a first etch stop 60, such as silicon nitride, is formed within the first dielectric layer 26 during its formation. Accordingly, the first etch stop 60 determines the actual depth $d_1$ of the first trench 28. A method of making the integrated circuit capacitor 20 including the anchor portions 42 of the second metal plug 22 will be discussed in greater detail below.

The illustrated multilayer interconnection line 32 includes a conductive capping layer 50, the conductor portion 52, and an electromigration barrier layer 54. The conductive capping layer 50 and the electromigration barrier layer 54 are preferably a refractory metal compound, and the conductor portion 52 is preferably an aluminum alloy. Additionally, an anti-reflective coating (ARC) 56, such as titanium nitride, may be formed on the interconnection line 32.

A second dielectric layer 36 on the interconnection line 32 includes the second trench 38 therein. The second trench 38 is formed adjacent the second metal plug 22 allowing the capacitor 20 to occupy a greater surface area, thus increasing its capacitance. The second metal plug 22 comprises a body portion 40 extending upwardly into the second trench 38, and anchor portions 42 connected to the body portion. The anchor portions 42 engage the anchoring recesses 34 for anchoring the second metal plug 22 to an exposed upper surface of the conductor portion 52 of the interconnection line 32.

In addition, the capacitance of the capacitor 20 can also be increased by forming in parallel a separate capacitor (not shown) overlying the interconnection line 32 adjacent the first trench 28. More particularly, a lower electrode of the separate capacitor is formed by an exposed section of the conductor portion 52 of the interconnection line 32, a dielectric layer is formed above this exposed section of the conductor portion, and a conducting layer is formed above the dielectric layer to define an upper electrode. The second metal plug 22 is then anchored to the anchoring recesses formed in the separate capacitor. This separate capacitor is now connected in parallel to the capacitor 20 formed adjacent the second metal plug 22, thus providing an increased effective capacitance.

The depth of the anchor portions 42 are preferably equal to a depth $d_1$ of the first trench 28. Furthermore, an additional depth is provided when portions of the ARC layer 56 and the capping layer 50 are removed when an opening for the second metal plug 22 is formed in the second dielectric layer 36. The ARC layer 56 and the capping layer 50 portions are removed so that the lowermost portions of the anchor portions 42 and the body portion 40 of the second metal plug 22 connect with the exposed conductor portion 52 of the interconnection line 32.

The exact depth at which the anchor portions 42 extend are not critical as long as the anchor portions extend deep enough adjacent the exposed conductor portion 52 to provide sufficient strength to lock the corresponding body portion 40 of the second metal plug 22 to the exposed conductor portion 52 of the interconnection line 32.

The depth $d_1$, of the first trench 28 is typically within about half the thickness of the first dielectric layer 26. For example, if the first dielectric layer 26 has a thickness in a range of about 4,000 to 6,000 angstroms, the depth $d_1$, of the first trench 28 would not exceed 2,000 to 3,000 angstroms. Otherwise, the first metal plug 30 would separate from the substrate 24 or underlying interconnection line (not shown) if the depth $d_1$, of the first trench 28 exceeded half the thickness of the first dielectric layer 26. Therefore, the relationship of the depth of the anchor portions 42 preferably corresponds to the depth $d_1$ of the first trench 28.

The capacitance of the capacitor 20 is increased by forming the second trench 38 in the second dielectric layer 36. The body portion 40 of the second metal plug 22 extends upwardly in a medial portion of the second trench 38. The second trench 38 is patterned, e.g., by conventional etching or other suitable techniques. For example, a second etch stop 62, such as silicon nitride, is formed within the second dielectric layer 36 during its formation. Accordingly, the second etch stop 62 determines the actual depth $d_2$ of the second trench 38.

With only a body portion 40 of the second metal plug 22, i.e., no anchor portions 42, the depth $d_2$ of the second trench 38 is typically limited to about half the thickness of the second dielectric layer 36. If the second dielectric layer 36 has a thickness in a range of about 4,000 to 6,000 angstroms, the depth $d_2$ of the second trench 38 would not exceed 2,000 to 3,000 angstroms. However, with the anchor portions 42 locking the body portion 40 of the second metal plug 22 to the exposed conductor portion 52 of the interconnection line 32, the depth $d_2$ of the second trench 38 can be greater than half the thickness of the second dielectric layer 36. Accordingly, the increased depth $d_2$ of the second trench 38 can now be in a range of about 2,000 to 5,500 angstroms.

Once the second trench 38 has been formed, the capacitor 20 is then formed. The first electrode 44 lines the second trench 38 and contacts the second metal plug 22. The first electrode 44 is made from any material suitable for conducting and holding an electric charge. Suitable materials include titanium, titanium nitride, aluminum, copper, silver or noble metals such as gold, platinum and/or palladium. The thickness of the first electrode 44 is preferably in a range of about 75 to 750 angstroms. It is also possible for the first electrode 44 to have a multi-layered arrangement, e.g., a layer of titanium coated with a layer of titanium nitride.

The third dielectric layer 48 overlies the first electrode 44 and is formed from any suitable dielectric, e.g., silicon dioxide, silicon nitride and/or any material or alloy of material having a suitably large dielectric constant. Other suitable materials include tantalum pentoxide and barium strontium titantate. The thickness of the third dielectric layer 48 is preferably in a range of about 25 to 250 angstroms.

The second electrode 46 overlies the third dielectric layer 48. Like the first electrode 44, the second electrode 46 is capable of being made from any material suitable for conducting and holding an electric charge. The thickness of the second electrode 46 is preferably in a range of about 150 to 2,500 angstroms. It is also possible for the second electrode 46 to have a multi-layered arrangement, or even an arrangement whereby a first material, such as aluminum, is doped with a second material, such as copper or silicon.

As an alternative to forming the capacitor 20 comprising the third dielectric layer 48 between the lower and upper electrodes 44, 46, the lower electrode is replaced by the upper portion of the second metal plug 22. In other words, the upper portion of the second metal plug 22 forms the lower electrode for the capacitor 20, as readily understood by one skilled in the art.

A method for making the integrated circuit capacitor 20 including a metal plug 22 as described above will now be further discussed with reference to FIGS. 2–7. First and second dielectric layers 26, 36 may be formed, for example, on a semiconductor substrate 24 with an interconnection line 32 therebetween. The semiconductor substrate 24 is preferably silicon, or may be silicon or a polysilicon layer or structure formed on the substrate. A plurality of devices, such as transistors (not shown), are formed in the substrate 24 using well known techniques.

Figure 2:
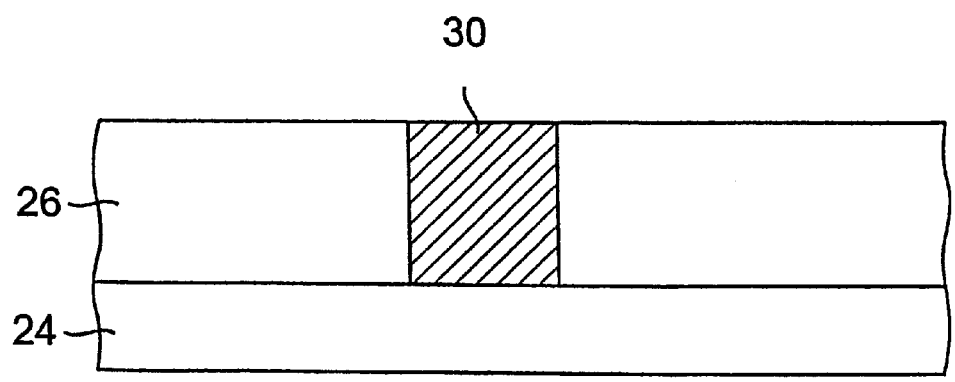
FIGS. 2–7 are cross-sectional views illustrating the process steps for making an integrated circuit capacitor including an anchored metal plug in accordance with the preset invention.

Referring now to FIG. 2, the first dielectric layer 26, such as a doped silicon dioxide, is formed over the substrate 24. Any well known technique can be used to form the first dielectric layer 26, such as chemical vapor deposition (CVD). The first dielectric layer 26 is preferably planarized at this time by chemical-mechanical polishing or by etch back to form a planar top surface. The resulting thickness of the first dielectric layer 26 should be thick enough after planarization to provide adequate electrical isolation of the active devices formed in the substrate 24, or isolation from an underlying interconnection line. An approximate thickness of 4,000 to 6,000 angstroms for the first dielectric layer 26 provides suitable isolation.

A photoresist layer (not shown) is formed and patterned over the first dielectric layer 26 using well known photolithography techniques to define the location where the first metal plug 30 is to be formed. Next, the exposed portions of the first dielectric layer 26 are etched until a conductor portion (not shown) of the substrate 24 is exposed. In one embodiment, a reactive ion etch (RIE) is used to form the opening for the first metal plug 30.

Still referring to FIG. 2, the opening is filled with a conductive material, preferably tungsten, using well known techniques for forming the first metal plug 30. Prior to forming the first metal plug 30, a thin adhesion/barrier layer, such as titanium or titanium nitride (not shown), are blanket deposited over the first dielectric layer 26 and into the opening using well known techniques, such as sputtering. The conductive material of the first metal plug 30 is then deposited into the opening. A chemical-mechanical polishing technique is used to etch back the adhesion/barrier metals and the conductive material deposited on the first dielectric layer 26. Other well known etch back techniques can be used, such as reactive ion etching (RIE).

Figure 3:
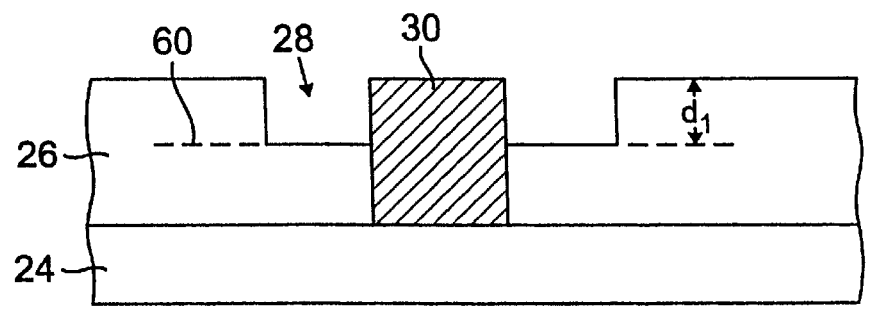

A first trench 28 is now formed adjacent the first metal plug 30, as best shown in FIG. 3. The first trench 28 is formed by patterning adjacent the first metal plug 30 using conventional etching or other suitable techniques. For example, a silicon nitride first etch stop 60 is formed within the first dielectric layer 26 during its formation. Accordingly, the first etch stop 60 determines the actual depth $d_1$, of the first trench 30.

Figure 4:
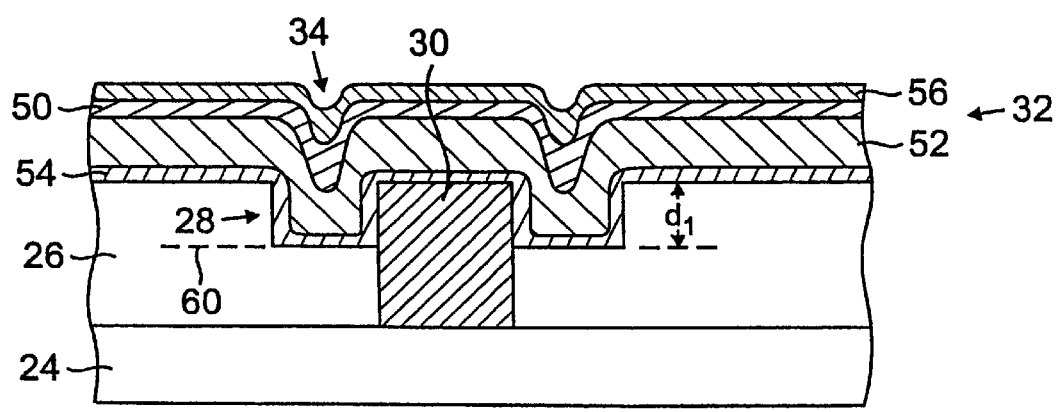

Referring now to FIG. 4, the interconnection line 32 is next formed on the first trench 28 and the first metal plug 30. In formation of the interconnection line 32, a titanium layer 54 of approximately 250 angstroms is formed over the first dielectric layer 26 using well known techniques, such as sputtering. Although a titanium layer is preferred, other refractory metal layers can be used. An approximately 4,500 angstrom thick aluminum alloy layer 52 comprising approximately 1% copper is formed on the titanium layer using well known techniques, such as sputtering. The aluminum alloy layer 52 is also referred to as the conductor portion. Although an aluminum alloy layer is preferred because of its low resistivity and its well known processes, other low resistance materials may act as the conductor portion 52 in the interconnection line 32, as will be appreciated by one skilled in the art. A layer of titanium 50 approximately 250 angstroms thick is formed on the conductor portion 52 by sputtering. Although titanium is preferred, other refractory metal layers may be used. An anti-reflective coating (ARC) layer 56, such as titanium nitride, is formed over the titanium layer 50.

Figure 5:
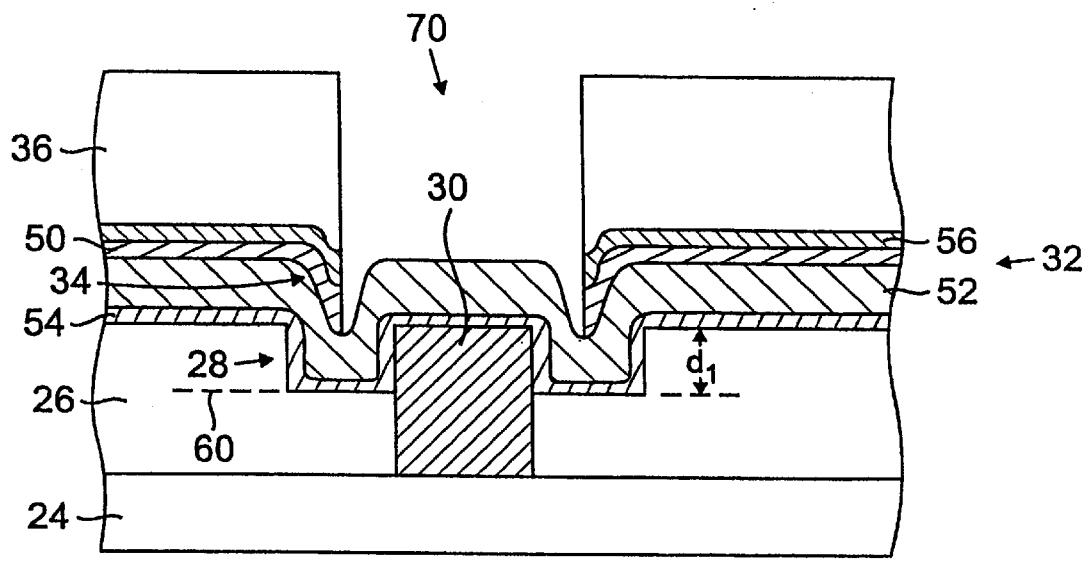

The second dielectric layer 36, such as a doped silicon dioxide, is formed over the interconnection line 32, including the anchoring recesses 34, as shown in FIG. 5. Any well known technique can be used to form the second dielectric layer 36, such as chemical vapor deposition (CVD). The second dielectric layer 36 is preferably planarized at this time by chemical-mechanical polishing or by etch back to form a planar top surface. The resulting thickness of the second dielectric layer 36 should be thick enough after planarization to provide adequate electrical isolation from the interconnection line 32. An approximate thickness of 4,000 to 6,000 angstroms for the second dielectric layer 36 provides suitable isolation.

A photoresist layer (not shown) is formed and patterned over the second dielectric layer 36 using well known photolithography techniques to define an opening 70 where the second metal plug 22 is to be formed. Next, the exposed portions of the second dielectric layer 36, the ARC layer 56 and the capping layer 50 are removed until the conductor portion 52 of the interconnection line 32 is exposed. In one embodiment, a reactive ion etch (RIE) is used to form the second opening 70 for the second metal plug 22.

Figure 6:
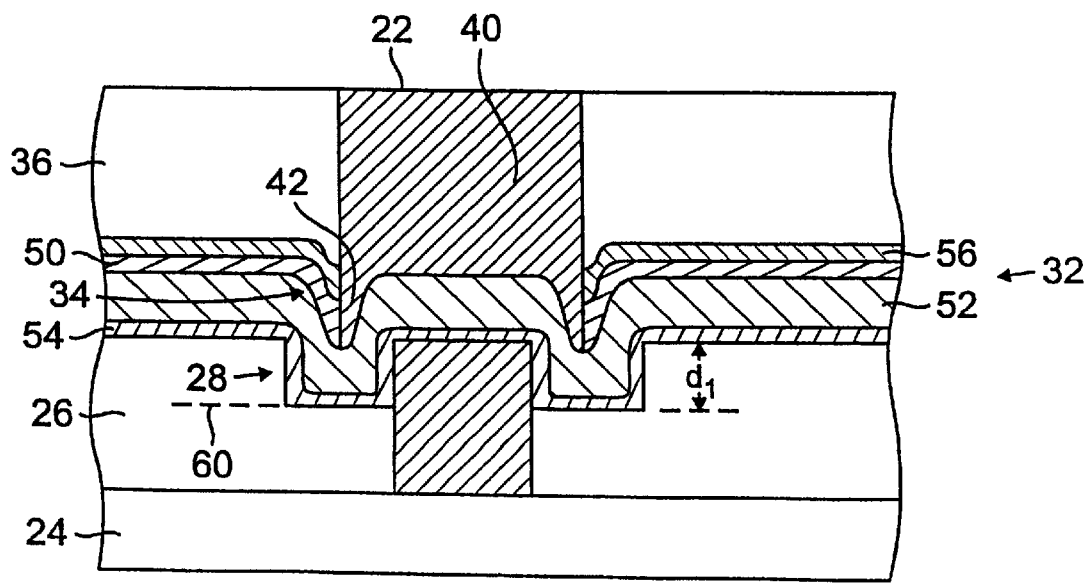

The second opening 70 is filled with a conductive material, preferably tungsten, using well known techniques for forming the anchor portions 42 and the body portion 40 of the second metal plug 22, as shown in FIG. 6. The anchor portions 42 and the body portion 40 are preferably formed as a monolithic unit. Prior to forming the second metal plug 32, a thin adhesion/barrier layer, such as titanium or titanium nitride (not shown), are blanket deposited over the second dielectric layer 36 and into the opening using well known techniques, such as sputtering. The conductive material of the second metal plug 22 is then deposited into the opening 70. A chemical-mechanical polishing technique is used to etch back the adhesion/barrier metals and the conductive material deposited on the second dielectric layer 36. Other well known etch back techniques can be used, such as reactive ion etching (RIE).

Figure 7:
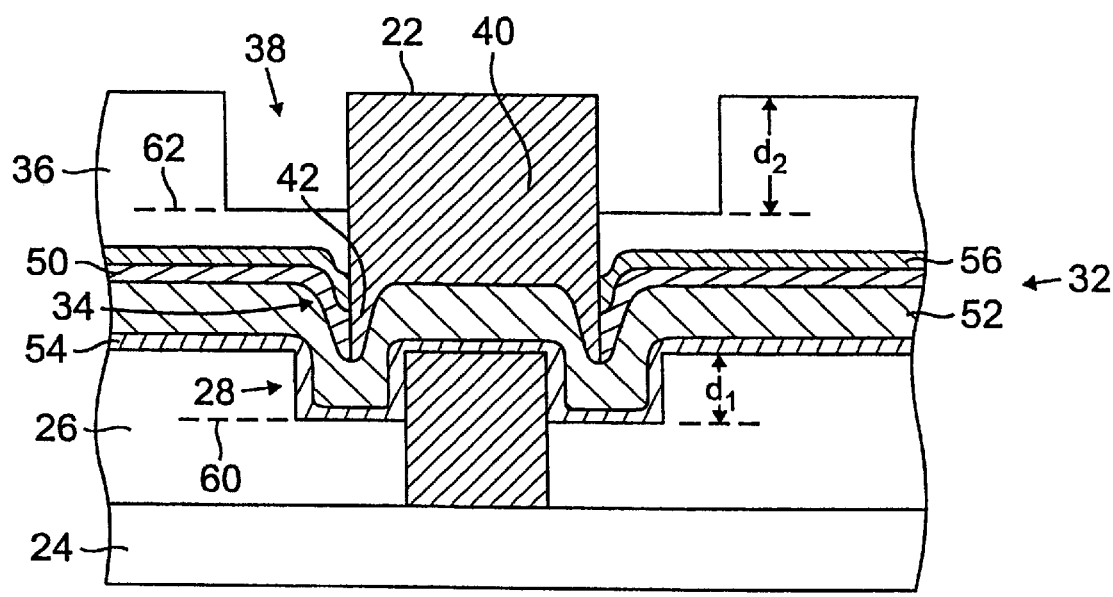

Referring now to FIG. 7, the second trench 38 is formed adjacent the second metal plug 22. The second trench 38 is formed by patterning adjacent the second metal plug 22 using conventional etching or other suitable techniques. For example, a silicon nitride second etch stop 62 is formed within the second dielectric layer 36 during its formation. Accordingly, the second etch stop 62 determines the actual depth $d_2$ of the second trench 38.

Because the second metal plug 22 is anchored to the conductor portion 52 of the interconnection line 32 via the anchoring portions 42, positioning of the second etch stop 62 can be greater without the metal plug becoming loose and separating from the underlying interconnection line 32. This advantageously allows the capacitance of the capacitor 20 to be increased because of the increased surface area available for forming the capacitor.

Once the second trench 38 has been formed, the first electrode 44 of the capacitor 20 is formed by depositing an electrically conductive material on the second dielectric layer 36, including the second trench 38 and the second metal plug 22. The first electrode 44 is then selectively patterned by an appropriate patterning technique such as chemical vapor deposition (CVD). Other methods of depositing the first electrode 44 may include sputtering, reactive sputter etching (RSE), and plasma enhanced chemical vapor deposition (PECVD).

The second dielectric layer 46 is deposited over the first electrode 44 and patterned using an appropriate technique. The third dielectric layer 48 may be deposited using CVD or any of the other techniques similar those used for depositing the first electrode 44. The second electrode 46 is then deposited by CVD, for example, and selectively patterned by an appropriate patterning technique. Other methods of depositing the second electrode 46 include physical vapor deposition (PVD), sputtering, reactive sputter etching (RSE), and plasma enhanced chemical vapor deposition (PECVD). The capacitor 20 thus includes the first and second electrodes 44, 46 and the third dielectric layer 48 therebetween, as shown in FIG. 1.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that modifications and embodiments are intended to be included within the scope of the appended claims.

That which is claimed is:

1. An integrated circuit capacitor comprising:
   a substrate;
   a first dielectric layer adjacent said substrate and having a first trench therein;
   a first metal plug extending upwardly into the first trench;
   an interconnection line overlying the first trench and contacting said first metal plug to define anchoring recesses on opposite sides of said first metal plug;
   a second dielectric layer on said interconnection line and having a second trench therein;
   a second metal plug comprising
      a body portion extending upwardly into the second trench, and
      anchor portions connected to said body portion and engaging the anchoring recesses to anchor said second metal plug;
   a third dielectric layer adjacent an upper portion of said second metal plug; and
   an upper electrode on said third dielectric layer.

2. An integrated circuit capacitor according to claim 1, further comprising an electrode between said second metal plug and said third dielectric layer.

3. An integrated circuit capacitor according to claim 1, wherein said body portion and said anchor portions of said second metal plug are integrally formed as a monolithic unit.

4. An integrated circuit capacitor according to claim 1, wherein the second trench has a depth greater than about half a thickness of said second dielectric layer.

5. An integrated circuit capacitor according to claim 1, wherein a depth of the second trench is greater than about 2,000 angstroms.

6. An integrated circuit capacitor according to claim 1, wherein said anchor portions of said second metal plug have a depth corresponding to a depth of the first trench.

7. An integrated circuit capacitor according to claim 1, wherein said body portion of said second metal plug has an upper most surface substantially co-planar with an adjacent uppermost surface of said second dielectric layer.

8. An integrated circuit capacitor according to claim 1, wherein said first metal plug has an upper most surface substantially co-planar with an adjacent uppermost surface of said first dielectric layer.

9. An integrated circuit capacitor according to claim 1, wherein each of said first and second metal plugs comprises tungsten.

10. An integrated circuit capacitor according to claim 1, wherein said body portion of said second metal plug extends upwardly in a medial portion of the second trench.

11. An integrated circuit capacitor according to claim 1, wherein said first metal plug extends upwardly in a medial portion of the first trench.

12. An integrated circuit capacitor comprising:
a substrate;
a first dielectric layer adjacent said substrate and having a first trench therein;
a first metal plug extending upwardly into the first trench;
an interconnection line overlying the first trench and contacting said first metal plug to define anchoring recesses on opposite sides of said first metal plug;
a second dielectric layer on said interconnection line and having a second trench therein, the second trench having a depth greater than about half a thickness of said second dielectric layer;
a second metal plug comprising
a body portion extending upwardly into the second trench, and
anchor portions connected to said body portion and engaging the anchoring recesses to anchor said second metal plug;
a third dielectric layer adjacent an upper portion of said second metal plug; and
an upper electrode on said third dielectric layer.

13. An integrated circuit capacitor according to claim 12 further comprising an electrode between said second metal plug and said third dielectric layer.

14. An integrated circuit capacitor according to claim 12, wherein said body portion and said anchor portions of said second metal plug are integrally formed as a monolithic unit.

15. An integrated circuit capacitor according to claim 12, wherein the depth of the second trench is greater than about 2,000 angstroms.

16. An integrated circuit capacitor according to claim 12, wherein said anchor portions of said second metal plug have a depth corresponding to a depth of the first trench.

17. An integrated circuit capacitor according to claim 12, wherein said body portion of said second metal plug has an upper most surface substantially co-planar with an adjacent uppermost surface of said second dielectric layer.

18. An integrated circuit capacitor according to claim 12, wherein said first metal plug has an upper most surface substantially co-planar with an adjacent uppermost surface of said first dielectric layer.

19. An integrated circuit capacitor according to claim 12, wherein each of said first and second metal plugs comprises tungsten.

20. An integrated circuit capacitor according to claim 12, wherein said body portion of said second metal plug extends upwardly in a medial portion of the second trench.

21. An integrated circuit capacitor according to claim 12, wherein said first metal plug extends upwardly in a medial portion of the first trench.

22. An integrated circuit capacitor comprising:
a substrate;
a first dielectric layer adjacent said substrate and having a first trench therein;
a first metal plug extending upwardly into the first trench having anchoring recesses on opposite sides of said first metal plug;
a second dielectric layer above said first dielectric layer and having a second trench therein;
a second metal plug comprising
a body portion extending upwardly into the second trench, and
anchor portions connected to said body portion and engaging the anchoring recesses to anchor said second metal plug;
a third dielectric layer adjacent an upper portion of said second metal plug; and
an upper electrode on said third dielectric layer.

23. An integrated circuit capacitor according to claim 22, further comprising an electrode between said second metal plug and said third dielectric layer.

24. An integrated circuit capacitor according to claim 22, further comprising an interconnection line overlying the first trench and contacting said first metal plug.

25. An integrated circuit capacitor according to claim 22, wherein said body portion and said anchor portions of said second metal plug are integrally formed as a monolithic unit.

26. An integrated circuit capacitor according to claim 22, wherein the second trench has a depth greater than about half a thickness of said second dielectric layer.

27. An integrated circuit capacitor according to claim 22, wherein a depth of the second trench is greater than about 2,000 angstroms.

28. An integrated circuit capacitor according to claim 22, wherein said anchor portions of said second metal plug have a depth corresponding to a depth of the first trench.

29. An integrated circuit capacitor according to claim 22, wherein said body portion of said second metal plug has an upper most surface substantially co-planar with an adjacent uppermost surface of said second dielectric layer.

30. An integrated circuit capacitor according to claim 22, wherein said first metal plug has an upper most surface substantially co-planar with an adjacent uppermost surface of said first dielectric layer.

31. An integrated circuit capacitor according to claim 22, wherein each of said first and second metal plugs comprises tungsten.

32. An integrated circuit capacitor according to claim 22, wherein said body portion of said second metal plug extends upwardly in a medial portion of the second trench.

33. An integrated circuit capacitor according to claim 22, wherein said first metal plug extends upwardly in a medial portion of the first trench.

* * * * *